United States Patent [19]

Tojo et al.

[11] 4,408,126
[45] Oct. 4, 1983

[54] CASSETTE RETAINING DEVICE OF ELECTRON BEAM APPARATUS

[75] Inventors: Toru Tojo, Yamato; Kazuyoshi Sugihara, Yokohama; Shuntaro Hata, Yokosuka; Hirooki Numaga, Numazu; Haruhisa Mukooyama, Fuji; Yoshio Suzuki, Numazu, all of Japan

[73] Assignees: Toshiba Machine Co., Ltd., Tokyo; Tokyo Shibaura Denki Kabushiki Kaisha, Kawasaki, both of Japan

[21] Appl. No.: 250,386

[22] Filed: Apr. 2, 1981

[30] Foreign Application Priority Data

Apr. 7, 1980 [JP] Japan ................................ 55/45479

[51] Int. Cl.³ ............................................. G21K 5/10
[52] U.S. Cl. .................................. 250/442.1; 378/181
[58] Field of Search .......................... 250/440.1, 442.1; 378/177, 179, 181

[56] References Cited

U.S. PATENT DOCUMENTS 3,581,094   5/1971  Peyser ................................. 378/181
3,771,781  11/1973  Lackey et al. ........................ 378/181
3,986,034  10/1976  Wittkopp et al. ..................... 378/181

Primary Examiner—Bruce C. Anderson
Attorney, Agent, or Firm—Oblon, Fisher, Spivak, McClelland & Maier

[57] ABSTRACT

A cassette retaining device comprises a pair of retaining mechanisms disposed respectively on both sides of the top surface of a sample table and pressing respectively on both sides of the top surface of a cassette to hold the cassette in said predetermined position between said retaining mechanisms and the sample table. Each retaining mechanism includes a presser capable of moving between a first position where the presser presses on a side portion of the top surface of the cassette to hold the cassette and a second position where the presser is separated from the top surface of the sample table to allow the cassette to be inserted or removed from between the presser and the sample table, a rocking arm rockable around a first pin relatively to the sample table and bearing the presser so that the presser may rock around a second pin parallel to the first pin, and a spring urging the rocking arm to rock in one direction, thereby locating the presser in the first position.

9 Claims, 11 Drawing Figures

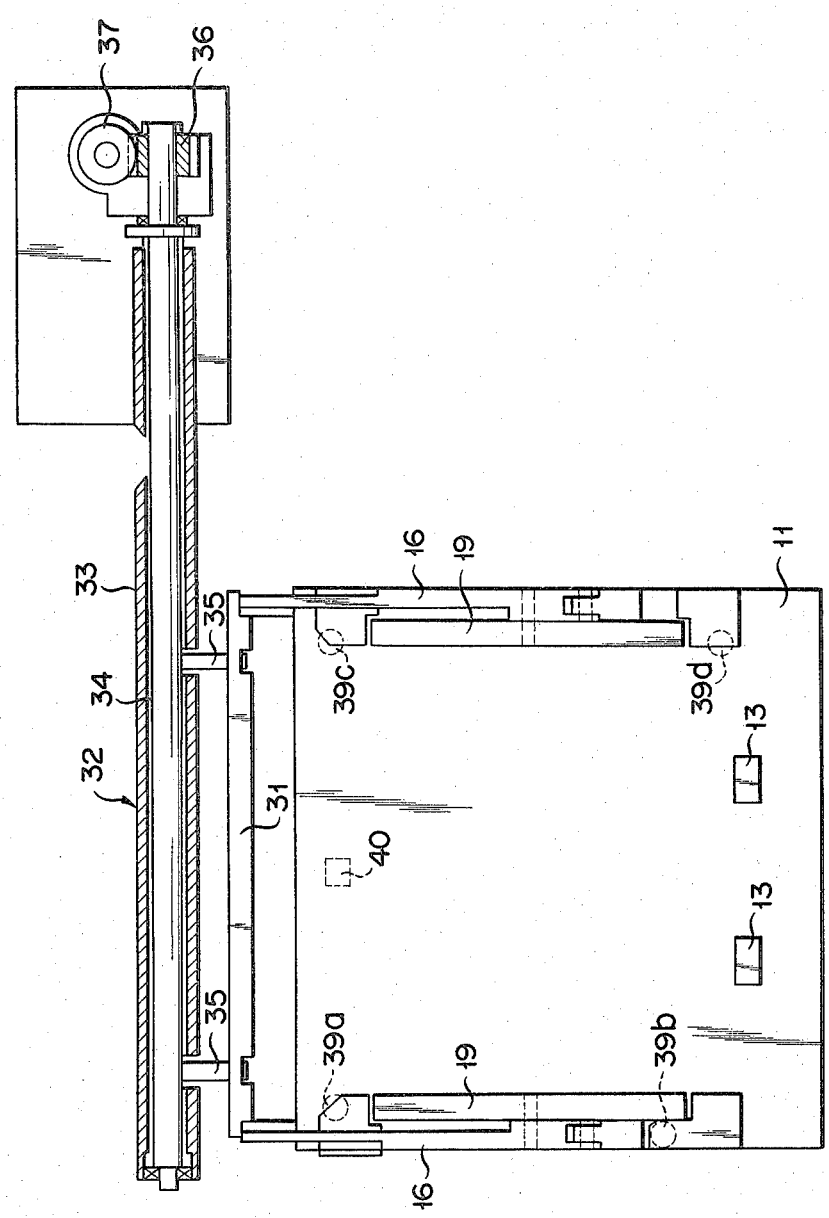

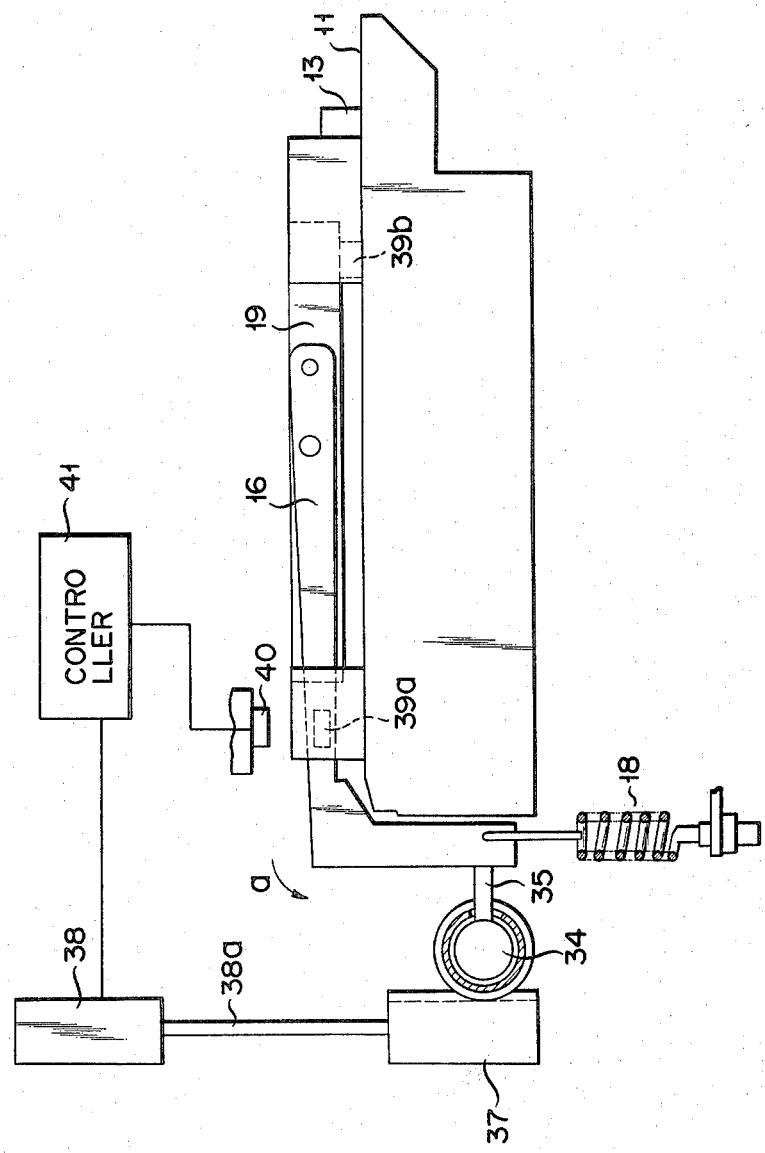

FIG. 4A    FIG. 4B
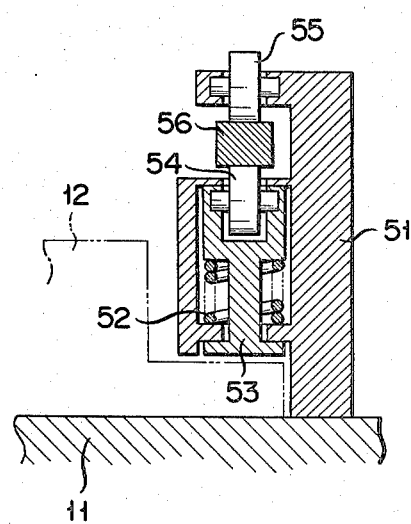
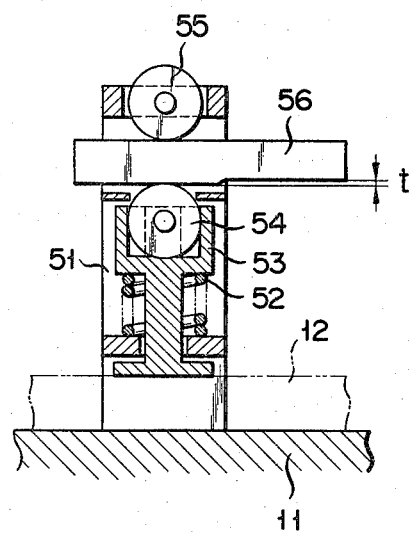
FIG. 5
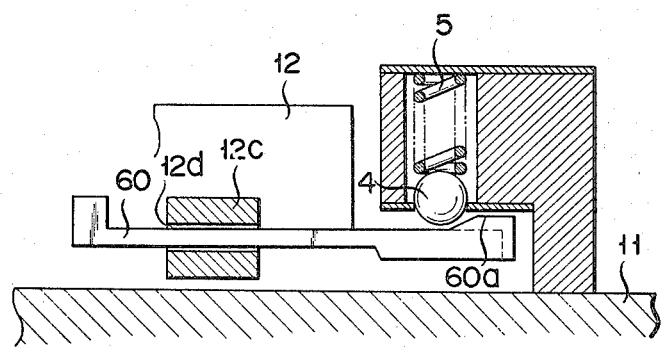

CASSETTE RETAINING DEVICE OF ELECTRON BEAM APPARATUS

This invention relates to a cassette retaining device for fixedly holding in place a cassette which fixedly retains a sample such as a semiconductor wafer or mask to be subjected to electron-beam irradiation.

In the electron-beam irradiation, the sample of this type need by accurately located and fixed on a sample table of an electron beam apparatus for fine processing in a submicron order. For this purpose, there is conventionally known a cassette retaining device as shown in FIGS. 1A to 1C. As shown in FIG. 1A, a pair of stops 3 protrude from the front portion of the top surface of a sample table 2 at a predetermined space from each other, engaging the insertion-side end face of a cassette 1 fixedly retaining a sample to regulate the angular position, as well as the front position, of the cassette. A pair of fixing or retaining mechanisms 7 are arranged on each side of the top surface of the sample table 2 along the direction of cassette insertion. As shown in FIG. 1B, each retaining mechanism 7 has a holder 6 fixed on the sample table 2 by means of a screw 8. The upper portion of the holder 6 is horizontally extended toward the cassette 1, and a flange formed on each side of the cassette 1 is inserted between the extended portion and the sample table 2. Bored through the extended portion is a vertical hole which is blocked up with end plates at both upper and lower ends and contains therein a steel sphere 4 and a compression spring 5 urging the sphere 4 downward. The sphere 4 has its bottom portion projected downward from the extended portion through a small opening in the lower end plate, and is maintained as it is by the spring 5.

In the cassette retaining device of the above-mentioned construction, the cassette 1 is slid on the top surface of the sample table 2 from the front part thereof, and stops when its front end abuts against the stops 3. During such sliding, the flanges on both sides of the cassette 1 are located between the sample table 2 and the respective extended portions of the holders 6, so that the top surface of each flange is always in contact with the sphere 4 urged by the spring 5. When the sliding action of the cassette 2 is stopped, therefore, the flange is pressed toward the sample table 2 by the sphere 4, and sandwiched and fixed between the table 2 and the sphere 4.

In such prior art device, the spheres 4 are forced upward against their corresponding springs 5 while the flanges of the cassette 1 are being inserted and slid between the spheres 4 and the sample table 2, so that the top surfaces of the flanges are always subjected to the urging force of the springs 5 through the spheres 4. As a result, the top surfaces of the flanges and the under surface of the cassette 1 are worn away by the top surface of the sample table 2 and the spheres 4 to produce abrasion dust. Such abrasion dust is undesirable because it may change the state of retention of the cassette or function as a charging source of electron beams. Also, the abrasion of the cassette will vary the condition of the cassette retention, complicating high-accuracy location and retention. For example, if the top surface of the flange is rendered uneven by abrasion, as shown in FIG. 1C, a lateral force F will be produced unnecessarily to shift the cassette at the time of retention.

Accordingly, the object of this invention is to provide a cassette retaining device of an electron beam apparatus capable of accurately fixing and retaining a cassette in a predetermined position on a sample table by simple operation.

In an aspect of this invention, there is provided a cassette retaining device which comprises a sample table, a stop means disposed on the top surface of the sample table and engaging the front end face of a cassette transferred along the top surface, whereby the cassette is stopped at a predetermined position, and a pair of retaining mechanisms disposed respectively on both sides of the top surface of the sample table and pressing respectively on both sides of the top surface of the cassette to hold the cassette in the predetermined position between the retaining mechanisms and the sample table, each of these retaining mechanisms including a presses on a side portion of the top surface of the cassette to hold the cassette and a second position where the presser is separated from the top surface of the sample table to allow the cassette to be inserted or removed from between the presser and the sample table, a working arm rockable around a first horizontal axis relatively to the sample table and bearing the presser so that the presser can rock around a second horizontal axis parallel to the first horizontal axis, and an urging means urging the rocking arm to rock in one direction, thereby locating the presser in the first position.

In the cassette retaining device according to the invention, the cassette is free from abrasion because it never comes in direct contact with the pressers and other retaining members during its transfer action. Accordingly, the cassette can be retained with high accuracy, and the retention or release of the cassette by the rocking action of the rocking arms enables compact and simple construction, as well as easy operation, of the retaining mechanisms.

This invention can be more fully understood from the following detailed description when taken in conjunction with the accompanying drawings, in which:

FIGS. 1A to 1C show a prior art cassette retaining device, in which FIG. 1A is a general perspective view, FIG. 1B is a sectional view of a retaining mechanism, and FIG. 1C is a sectional view showing the relationship between the retaining mechanism and a cassette;

FIGS. 2A to 2C show a cassette retaining device according to a first embodiment of this invention, in which FIG. 2A is a general plan view, FIG. 2B is a side view of a retaining mechanism holding a cassette, and FIG. 2C is a side view of the retaining mechanism without the cassette;

FIGS. 3A and 3B show a cassette retaining device according to a second embodiment of the invention, in which FIG. 3A is a plan view, and FIG. 3B is a partially broken, enlarged side view;

FIGS. 4A and 4B show a cassette retaining device according to a third embodiment of the invention, in which FIG. 4A is a profile of a retaining mechanism holding no cassette as viewed from one direction, and FIG. 4B is a profile of the retaining mechanism holding a cassette as viewed from another direction; and FIG. 5 is a sectional view showing a cassette retaining device according to a fourth embodiment of the invention.

Now there will be described cassette retaining devices of electron beam apparatus according to preferred embodiments of this invention with reference to the accompanying drawings.

Figure 2A:
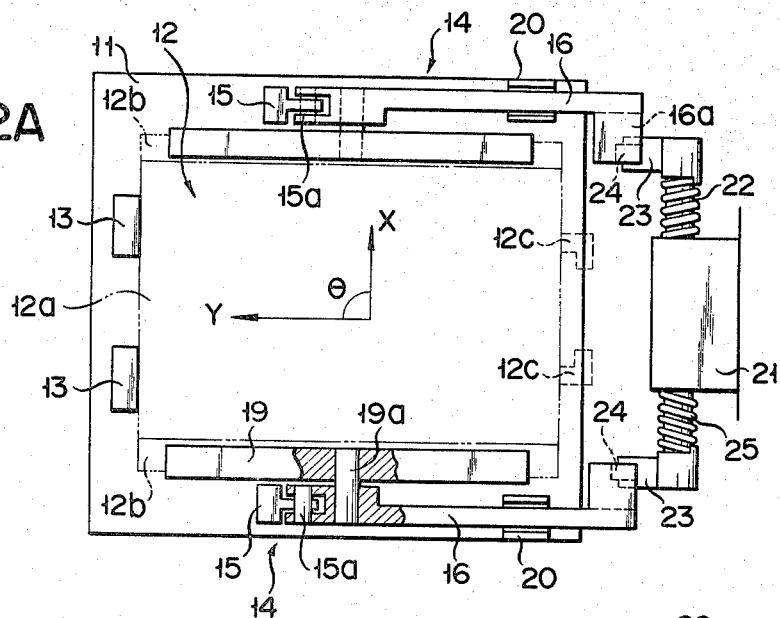
Figure 2B:
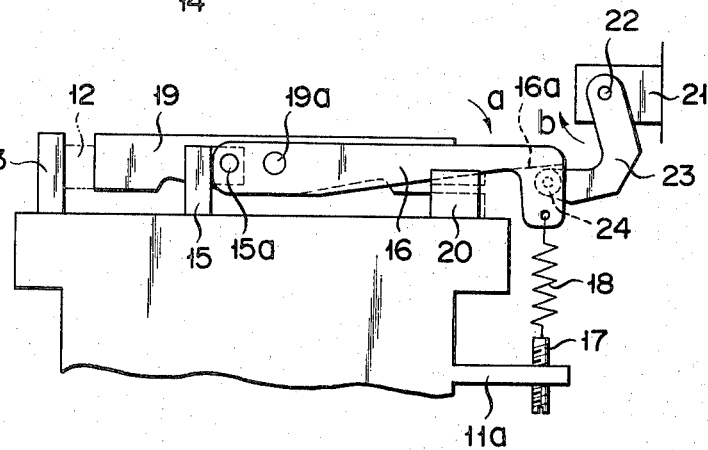
Figure 2C:
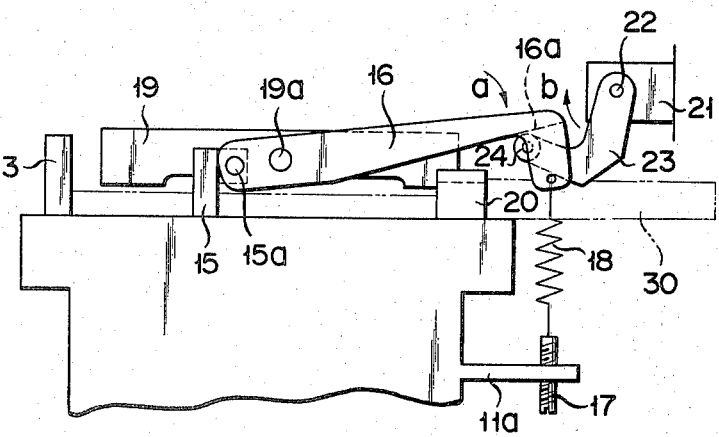

In FIGS. 2A to 2C showing a cassette retaining device according to a first embodiment of the invention, numeral 11 designates a horizontal sample table with a flat top which is formed of, for example, an X-Y table disposed inside an exposure chamber of an electron beam apparatus. A cassette 12, as represented by a chain line in FIG. 2A, is to be mounted and fixedly retained on the sample table 11. In the cassette 12, a sample such as a semiconductor wafer or mask to be subjected to electron-beam irradiation, e.g. exposure, is pressed and fixedly retained by means of a suitable adhesive or spring. The cassette 12 is of a conventional construction including a rectangular, flat main body 12a and flanges 12b protruding severally from both sides of the main body 12a and having their top surfaces lower than that of the main body 12a. The cassette 12 is provided with a pair of engaging portions 12c protruding from its rear end and engaging a transfer rod to enable a Y-direction movement of the cassette 12 by the action of the transfer rod.

A pair of stops 13 protrude from the front portion of the top surface of the sample table 11 at a predetermined space along the X-direction so that the end faces of the stops 13 may be on the same plane along the X-direction. The stops 13 engage the front end face of the cassette inserted in the same manner as the case of the prior art device, thereby regulating the Y-direction position and $\theta$-direction angular position of the cassette.

Retaining mechanisms 14 are disposed on both sides of the top surface of the sample table 11, respectively. Each retaining mechanism 14 includes a base block 15 fixed on the sample table 11 and a rocking arm 16 which has its proximal end pivotally mounted on a pin 15a protruding from the base block 15 along the X-direction and may rock around the pin 15a or a first horizontal axis within a vertical plane including the Y-direction. The tip end of the arm 16 is projected beyond the rear end of the sample table 11, and an engaging step portion 16a is formed on the inside of the lower portion of the tip end. The tip end of the arm 16 is coupled with the upper end of a tension spring 18 the lower end of which is connected with a vertically extending adjust screw 17 screwed in a base member 11a which protrudes from the lower portion of the rear end face of the sample table 11. Thus, the rocking arm 16 is always urged by the spring 18 to rock in the direction of an arrow a in FIGS. 2B and 2C. The urging force of the spring 18 can be adjusted by turning the adjust screw 17. The middle portion of a presser 19 as taken along the longitudinal direction is pivotally mounted on a substantially middle portion of the arm 16 by means of a pin 19a extending in parallel to the pin 15a. Thus, the presser 19 can rock relatively to the arm 16 around the pin 19a or a second horizontal axis within a vertical plane. The presser 19 is formed of an elongate plate member extending in the Y-direction with the pivotal point as its center and having horizontal pojected end faces formed on the under surfaces of its extended ends. When the arm 16 is rocked in the direction of the arrow a by the urging force of the spring 18, the horizontal projected end faces of the presser 19 press on the top surface of the flange of the cassette, thereby retaining the cassette on the sample table 11. In the figures, numeral 20 designates a guide and stop member fixed on the sample table 11. The arm 16 is prevented from shifting crosswise while rocking by a rectangular groove in the top surface of the member 20 inside which the arm 16 is to rock. Further, the rocking action of the arm 16 in the direction of the arrow a by the spring 18 may be regulated by the abutment of the arm 16 against the bottom of the rectangular groove.

Disposed on the free-end side of the arm 16 is a fixed block 21 which bears a shaft 22 extending along the X-direction so that the shaft 22 can rock around its longitudinal axis. Both extended ends of the shaft 22 are fitted respectively with the proximal ends of two arms 23 so that the arms 23 may rock together with the shaft 22. Rotatably borne by the distal end of each arm 23, a roller 24 is urged in the direction of an arrow b by a torsion spring 25 connected between the shaft 22 and the block 21 so as to face the stepped bottom surface of the tip end of the rocking arm 16. When the arm 23 is rocked further in the direction of the arrow b, the roller 24 abuts against the stepped bottom surface of the rocking arm 16 to rock the arm 16 in the opposite direction to the arrow a around the pin 15a. As a result, the presser 19 is moved away from the top surface of the flange of the sample table 11, i.e. in the upward direction, so that the space between the presser 19 and the sample table 11 is widened. Meanwhile, when the rocking force in the direction of the arrow b ceases to be applied to the arm 23, the rocking arm 16 is rocked in the direction of the arrow a by the spring 16, and the presser 19 is moved downward.

Now there will be described the operation of the cassette retaining device of the above-mentioned construction.

First, the cassette 12, with its rear-side engaging portions 12c engaged with the transfer rod (designated by numeral 30 in FIG. 2C), is put on the rear portion of the top surface of the sample table 11, and is slid forward by means of the transfer rod. When the front end of the cassette 12 reaches a position corresponding to the rollers 24, the cassette 12 forces up the rollers 24 to move further in the forward direction, thereby causing the rollers 24 to roll on the top surface of the cassette 12. When the rollers 24 are pressed upward, the rocking arm 16 is rocked in the opposite direction to the arrow a by the rollers 24. Accordingly, as mentioned before, the presser 19 is raised up as shown in FIG. 2C to create between the presser 19 and the sample table 11 a space wide enough to allow the insertion of the flange 12b of the cassette 12. Thus, as the transfer rod is further pushed forward, the cassette 12, with its flanges 12b located under their corresponding pressers 19, is moved up to the stops 13, where it is stopped. Subsequently, when the transfer rod is disengaged from the cassette 12, the rocking arm 16 is rocked in the direction of the arrow a, and the presser 19 is lowered to press the flange 12b of the cassette 12 against the top surface of the sample table 12 by means of the urging force of the spring 18. Thus, the cassette 12 is fixedly held in place on the sample table 11. In the removal of the cassette 12, when the transfer rod is brought close to the engaging portions 12c of the cassette 12 to be engaged therewith, the rollers 24 are forced up (in the direction of the arrow b) by the transfer rod, so that the pressers 19 are moved upward from their corresponding flanges 12b of the cassette 12 by the actions of their corresponding rocking arms 16. Thus, the cassette 12 is released from the retention by the pressers 19. Thereafter, the transfer rod is pulled to draw out the cassette 12 from the top surface of the sample table, and thus the cassette 12 is removed from the retaining device.

In the cassette retaining device of the above-mentioned construction, the cassette will hardly wear away because it will never be in contact with the pressers during its transfer action for the setting or removal, and will never be pressed against the top surface of the sample table by any means. As a result, the cassette can always be held in place with high accuracy without the problem of charging due to abrasion dust. Further, the press on the cassette can be secured and released automatically by the cassette setting and removing operations, respectively.

Referring now to FIGS. 3A and 3B, there will be described a cassette retaining device according to a second embodiment of the invention.

In this embodiment, like reference numerals are used to designate substantially the same portions as in the foregoing embodiment, and detailed description of such portions is omitted herein.

Each rocking arm 16 for the vertical movement of the corresponding presser 19 relative to a sample table 11 is connected with a spring 18 in the same manner as the foregoing embodiment, and is always urged to rock in the direction of an arrow a of FIG. 3B. Both rocking arms 16 are rocked by the rocking action of a bridge plate 31 which is stretched between the respective tip ends of the rocking arms 16. A driving mechanism 32 of the bridge plate 31 has a rockable shaft 34 rockably borne inside a bearing sleeve 33. The shaft 34 is provided with a pair of arms 35 protruding therefrom through the bearing sleeve 33 and having their tip ends facing the under side of the bridge plate 31. A pinion 36 is coaxially fixed to one end of the shaft 34, and a rack 37 is disposed in gear with the pinion 36 so as to be able to move in the vertical direction. Fixed on a shaft 38a of a plunger 38, as shown in FIG. 3B, the rack 37 is selectively moved up and down by the plunger 38.

Four guide rollers 39a to 39d are arranged on both sides of the top surface of the sample table 11 so as to be able to rotate on their respective vertical axes. These guide rollers are in rolling contact with the side faces of the cassette to prevent the cassette from unduly shifting in the X-direction during the transfer action for the setting or removal thereof. The three rollers 39a, 39c and 39d are separated from the top surface of the sample table 11 at a space wider than the thickness of the flanges of the cassette to be in rolling contact with the side faces of the main body of the cassette, while the remaining roller 39b is disposed substantially on the sample table 11 to be in rolling contact with the side face of one flange of the cassette.

Over the rear portion of the top surface of the sample table 11, there is disposed a detecting mechanism 40 for detecting the position of the cassette where the cassette abuts against stops 13. The detecting mechanism 40 can be composed of, for example, a combination of a photo diode to project a light on a reflecting portion formed on a predetermined position of the top surface of the cassette, and a photo cell receiving the light from the reflecting portion to convert it into an electric signal. The signal from the detecting mechanism 40 is transmitted to a controller 41 for the control of the plunger 38.

In the cassette retaining device of the above-mentioned construction, the plunger 38 is lowered by means of a manual switch or a switch for detecting the cassette motion when the cassette is inserted, and the rocking arms 16 are rocked by means of the rocking shaft 34 in the opposite direction to the arrow a against the urging force of the spring 18. As a result, the pressers 19 are raised up to positions where the cassette can be inserted. In this state, the cassette is slid forward with its flanges located under the pressers 19 until its front end abuts against the stoppers 13. Thus, the cassette is located in place. The detecting mechanism 40 detects such state and deenergizes the plunger 38 by means of the controller 41. In consequence, the rocking arm 16 is rocked in the direction of the arrow a by the spring 18, and the presser 19 is lowered to press each flange of the cassette against the sample table 11, thereby holding the cassette in place. The cassette may be removed by driving again the plunger 38 to separate the pressers 19 from the top surfaces of their corresponding flanges of the cassette by means of the rocking arms 16.

Referring now to FIGS. 4A and 4B, there will be described a cassette retaining device according to a third embodiment of the invention.

This retaining device is provided with four retaining mechanisms—two on each side of a sample table 11. Each retaining mechanism includes a base member 51 having in the middle portion thereof a projection with a cavity therein and erected on the top surface of the sample table 11. Held in the cavity of the base member 51 is a vertically movable presser member 53 the lower end of which is extended from the projection to face the top surface of the sample table 11. The cavity further contains therein a compression spring 52 to urge the presser member 53 upward. Moreover, a roller 54 is borne by the upper portion of the presser member 53 so as to be able to rotate around a horizontal axis. The top portion of the roller 54 is projected from the top surface of the projection of the base member 51. Borne by another projection formed at the upper portion of the base member 51, furthermore, is another roller 55 facing the roller 54 at a given space therefrom and having a rotating axis parallel to that of the roller 54. Thus, these rollers 54 and 55 constitute a pair of pinch rollers between which a wedge piece 56 consisting of thick and thin portions connected by a slant face is interposed.

In the cassette retaining device of the above-mentioned construction, the wedge piece 56 is located so that its thin portion is interposed between the pinch rollers 54 and 55 as shown in FIG. 4A during the insertion or removal of the cassette, and the presser member 53 is retained in an upper position by the urging force of the spring 52. Then, after the cassette is located in the predetermined position on the sample table 11, the wedge piece 56 is moved to have its thick portion interposed between the pinch rollers 54 and 55. Thus, the presser member 53 is moved downward by the thick portion through the roller 54, and a flange of the cassette 12 is pressed and retained on the sample table 11. The distance t between the lower surfaces of the thin portion and thick portion of the wedge piece 56 is set so that the presser member 53 can fulfill its functions in its retaining position (first position) and free position (second position).

Referring now to FIG. 5, there will be described a cassette retaining device according to a fourth embodiment of the invention.

Figure 1A:
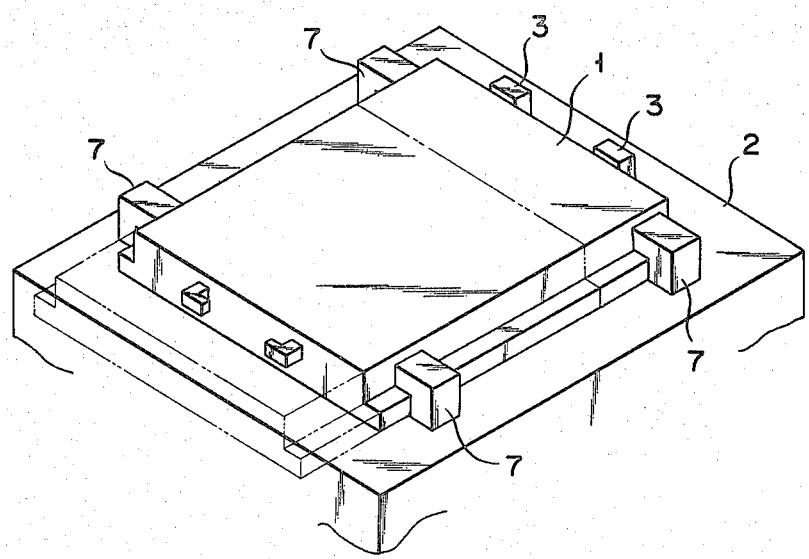
Figure 1B:
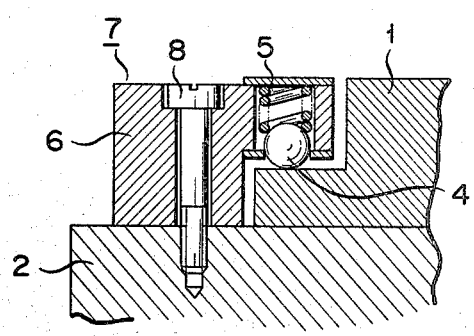
Figure 1C:
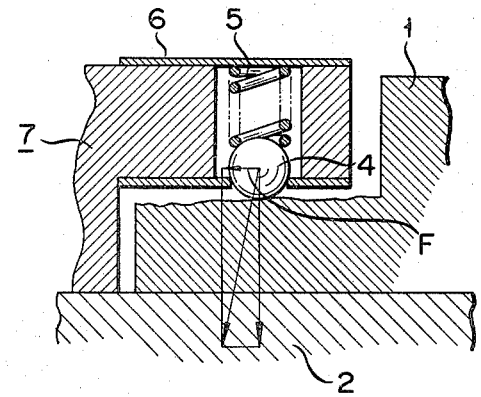

Being substantially the same as those of the prior art device shown in FIGS. 1A and 1B, the components of retaining mechanisms of this embodiment are designated by like reference numerals and explanation of such components is omitted below.

A through hole 12d is bored through an engaging portion 12c of a cassette 12 along the transverse direction of the cassette or the X-direction, and a wedge piece 60 is extended through the hole 12d so as to be able to move along its longitudinal direction. Formed on the top surface of the outside end of the wedge piece 60 is an engaging surface 60a raised through the medium of a slant face.

Thus, at the cassette setting, the wedge piece 60 is held so that its lower top surface may be located under a steel sphere 4, as shown in FIG. 5. When the cassette is located in place, the wedge piece 60 is moved inward to have its engaging surface or higher top surface 60a located under the sphere 4. At this time, the sphere 4 is moved upward by the slant face and the engaging surface against the urging force of a spring 5. As a result, the wedge piece 60 is pressed by the sphere 4, and the cassette 12 is finally held on a sample table 11.

What is claimed as new and desired to be secured by Letters Patent of the United States is:

1. A cassette retaining device comprising:
   a sample table;
   a stop means disposed on the top surface of said sample table and engaging the front end face of a cassette transferred along said top surface, whereby said cassette is stopped at a predetermined position in surface contact with said top surface; and
   a pair of retaining mechanisms disposed respectively on both sides of the top surface of said sample table and mounted for pressing respectively on both sides of the top surface of the cassette to hold said cassette in said predetermined position between said retaining mechanisms and said sample table,
   each said retaining mechanism including:
   a presser capable of moving in a direction having a component perpendicular to said top surface of said cassette, between a first position where said presser presses in said direction on a side portion of the top surface of the cassette to hold said cassette in surface contact with said top surface, and a second position where said presser is separated from the top surface of said sample table to allow said cassette to be inserted or removed from between said presser and said sample table;
   a rocking arm rockable around a first horizontal axis relatively to said sample table and bearing said presser so that said presser may rock around a second horizontal axis parallel to said first horizontal axis; and
   an urging means urging said rocking arm to rock in one direction, thereby locating said presser in said first position.

2. A cassette retaining device according to claim 1, wherein said rocking arm is rockably borne at one end by said sample table, and said presser is rockably borne by the middle portion of said rocking arm.

3. A cassette retaining device according to claim 2, wherein said presser is an elongate plate extending along the side portion of the cassette in said predetermined position, the longitudinal center of said presser being rockably borne by said rocking arm.

4. A cassette retaining device according to claim 3, wherein said urging means includes a spring for elastically rocking said rocking arm.

5. A cassette retaining device according to claim 4 further comprising a driving mechanism for rocking said rocking arm in the other direction to locate said presser in said second position.

6. A cassette retaining device according to claim 5, wherein said driving mechanism includes a roller engaging the top surface of the cassette being inserted and coming in rolling contact with said rocking arm to rock said rocking arm in said other direction, and a rockable arm rotatable bearing said roller.

7. A cassette retaining device according to claim 5, wherein said driving mechanism includes a rotating shaft, a driving arm protruding from said shaft and having an end portion facing the free end of said rocking arm, and a rocking mechanism rotating said rotating shaft to rock said rocking arm in said other direction by means of said driving arm.

8. A cassette retaining device according to claim 7, wherein said rocking mechanism includes a pinion fixed to one end of said rotating shaft, a rack in gear with said pinion, and a plunger for moving said rack.

9. The device of claim 1 including means for subjecting said cassette to electron beam irradiation.

* * * * *